(12) United States Patent
Elwan et al.

(10) Patent No.: US 7,525,372 B2
(45) Date of Patent: Apr. 28, 2009

(54) NOISE SHAPED N TH ORDER FILTER

(75) Inventors: Hassan Elwan, Lake Forest, CA (US);
Amr Fahim, Newport Beach, CA (US);
Aly Ismail, Irvine, CA (US); Edward Youssoufian, Irvine, CA (US)

(73) Assignee: Newport Media, Inc., Lake Forest, CA (US)

( * ) Notice: Subject to any disclaimer, the term of this patent is extended or adjusted under 35 U.S.C. 154(b) by 140 days.

(21) Appl. No.: 11/683,651

(22) Filed: Mar. 8, 2007

(65) Prior Publication Data
US 2008/0220737 A1    Sep. 11, 2008

(51) Int. Cl.
*H03B 1/00* (2006.01)
*H03K 5/00* (2006.01)

(52) U.S. Cl. .................. 327/552; 327/556
(58) Field of Classification Search .......... 327/551–559
See application file for complete search history.

(56) References Cited

U.S. PATENT DOCUMENTS

| | | | | |
|---|---|---|---|---|
| 6,055,016 A | * | 4/2000 | Darden et al. | 348/250 |
| 6,060,875 A | * | 5/2000 | Capici et al. | 323/354 |
| 6,967,606 B2 | * | 11/2005 | Wiesbauer et al. | 341/143 |
| 6,970,057 B2 | * | 11/2005 | Lin et al. | 333/177 |
| 7,099,647 B2 | * | 8/2006 | Woo et al. | 455/317 |
| 2002/0041458 A1 | * | 4/2002 | Kobayashi et al. | 360/65 |
| 2006/0164159 A1 | * | 7/2006 | Kimura | 327/552 |

OTHER PUBLICATIONS

Harjani, R., "A Low-Power CMOS VGA fro 50 Mb/s Disk Drive Read Channels," IEEE Transactions on Circuits and Systems-II: Analog and Digital Signal Processing, Col. 42, No. 6, Jun. 1995, pp. 370-376.

* cited by examiner

*Primary Examiner*—Quan Tra
(74) *Attorney, Agent, or Firm*—Rahman LLC

(57) ABSTRACT

A low noise nth order filter, system, and method includes a plurality of nested general immittance converters (GICs) operatively connected to one another in successive GIC stages; and a capacitor operatively connected to each of the GICs, wherein a first successive GIC stage begins at a first node located in between a previous GIC stage and a corresponding capacitor operatively connected to the previous GIC stage. A second successive GIC stage begins at a second node located in between the first node and the first successive GIC stage. The filter may further comprise a resistor operatively connected to at least one successive GIC stage, wherein the resistor is preferably located in between the first node and the first successive GIC stage.

20 Claims, 6 Drawing Sheets

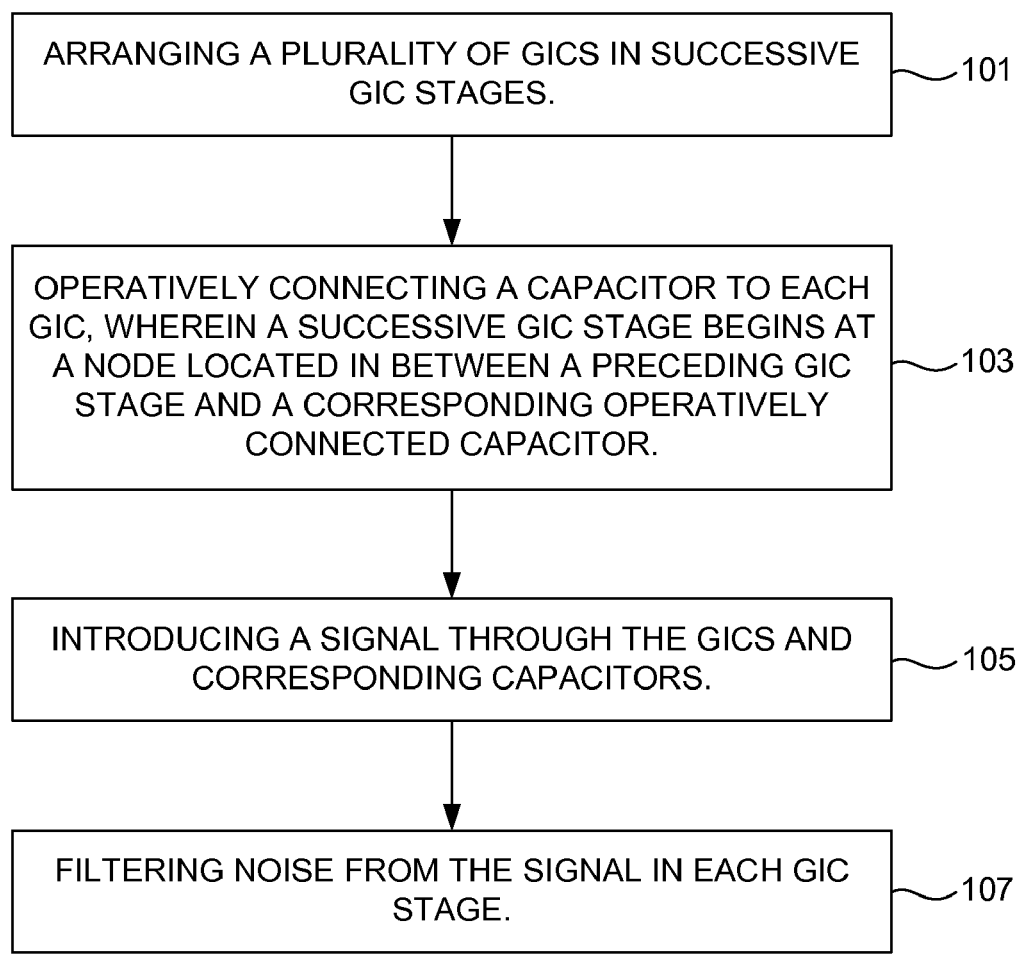

NOISE SHAPED N TH ORDER FILTER

BACKGROUND

1. Technical Field

The embodiments herein generally relate to electrical filters, and, more particularly, to noise shaping active filters.

2. Description of the Related Art

Active filters are often realized using transconductance-C (gm-c) topologies or operational amplifier (opamp) based RC topologies. There are many ways to implement higher order filters using these two techniques; however, both techniques generally suffer from a limited noise performance. This is because the active and passive components in both gm-c and opamp-based active filter are in the signal path, which adds noise directly to the signal at all frequencies (i.e., no noise shaping is employed). Unfortunately, attempting to reduce the noise of such active filters to acceptable levels leads to prohibitively large power and area penalties.

Accordingly, the conventional filter solutions tend to suffer from the following: 1) higher noise that prevents such higher order filters from being used in low noise applications (such as a post-mixer amplifier in a wireless integrated receiver); 2) in many of these topologies increasing the filter order directly increases the noise; and 3) larger area and power consumption. Accordingly, there remains a need for a new noise shaping filter that reduces noise, power consumption, and accommodates a high dynamic range.

SUMMARY

In view of the foregoing, an embodiment provides a low noise nth order filter comprising a plurality of nested general immittance converters (GICs) operatively connected to one another in successive GIC stages; and a capacitor operatively connected to each of the GICs, wherein a first successive GIC stage begins at a first node located in between a previous GIC stage and a corresponding capacitor operatively connected to the previous GIC stage. Preferably, a second successive GIC stage begins at a second node located in between the first node and the first successive GIC stage. The filter may further comprise a resistor operatively connected to at least one successive GIC stage, wherein the resistor is preferably located in between the first node and the first successive GIC stage. The plurality of nested GICs may be connected in parallel only. Alternatively, the plurality of nested GICs may be cascaded in successive GICs stages and are connected in parallel. Preferably, successive GIC stages are adapted to attenuate out-of-band signals in a current domain thereby allowing a gain of a preceding GIC stage to be increased.

Another embodiment provides a method of filtering noise from an electrical signal, wherein the method comprises arranging a plurality of GICs in successive GIC stages; operatively connecting a capacitor to each GIC, wherein a successive GIC stage begins at a node located in between a preceding GIC stage and a corresponding operatively connected capacitor; introducing a signal through the GICs and corresponding capacitors; and filtering noise from the signal in each GIC stage. The method may further comprise operatively connecting a resistor to at least one successive GIC stage, wherein the resistor may be located in between the node and a successive GIC stage. The method may further comprise connecting the plurality of GICs in parallel only. Also, the method may further comprise cascading successive GIC stages in parallel. Preferably, successive GIC stages are adapted to attenuate out-of-band signals in a current domain thereby allowing a gain of a preceding GIC stage to be increased.

Another embodiment provides a system for filtering noise from an electrical signal, wherein the system comprises an antenna adapted to receive a wireless electrical signal; a low noise amplifier (LNA) operatively connected to the antenna and adapted to amplify the wireless electrical signal; a mixer operatively connected to the LNA adapted to combine the amplified wireless electrical signal with a local oscillator (LO) signal; and a low noise filter operatively connected to the mixer, wherein the low noise filter comprises a plurality of GICs arranged in successive GIC stages; a capacitor operatively connected to each GIC, wherein a successive GIC stage beings at a node located in between a preceding GIC stage and a corresponding capacitor operatively connected to the preceding GIC stage; a baseband component operatively connected to the low noise filter; and an analog-to-digital converter adapted to convert the filtered wireless electrical signal to a digital signal. Preferably, a second successive GIC stage begins at a second node located in between the first node and the first successive GIC stage. The system may further comprise a resistor operatively connected to at least one successive GIC stage, wherein the resistor may be located in between the first node and the first successive GIC stage. In one embodiment, the plurality of GICs are connected in parallel only. Alternatively, the plurality of GICs are cascaded in successive GICs stages and are connected in parallel. Preferably, successive GIC stages are adapted to attenuate out-of-band signals in a current domain thereby allowing a gain of the preceding GIC stage to be increased.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIG. 6 is a flow diagram illustrating a preferred method according to an embodiment herein.

DETAILED DESCRIPTION OF PREFERRED EMBODIMENTS

Figure 1:
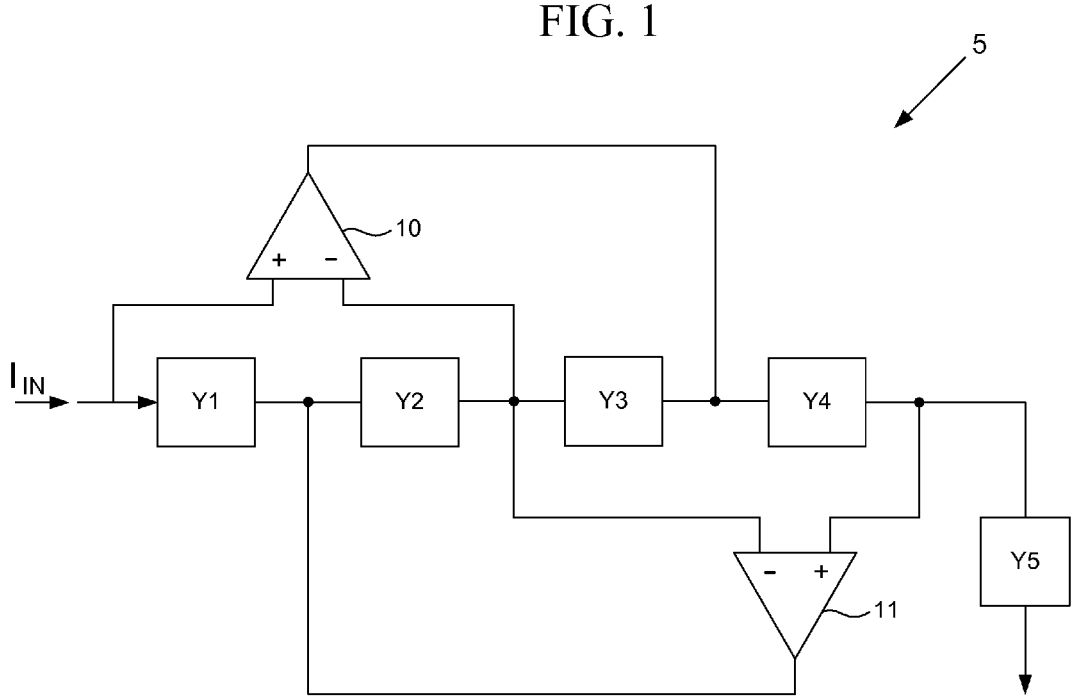
FIG. 1 illustrates a schematic diagram of a general immittance converter (GIC) used in accordance with the embodiments herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

As mentioned, there remains a need for a new noise shaping filter that reduces noise, power consumption, and accommodates a higher dynamic range. The embodiments herein achieve this by providing an nth order filter that shapes the noise in the active and passive elements of the filter in order to move the noise out of the passband of the filter. Referring now to the drawings, and more particularly to FIGS. 1 through 6, where similar reference characters denote corresponding features consistently throughout the figures, there are shown preferred embodiments.

The embodiments herein provide a technique that enables the implementation of low noise high selectivity nth order filters with low-power consumption and having a wide dynamic range. Filters implemented using this technique may achieve the following characteristics:

1. Higher order filter topologies with high selectivity and low noise.
2. The filter attenuates the out-of-band signals in the current domain thus allowing the gain of the preceding stage to be increased. This relaxes the noise specification of the filter and all of the blocks after the filter.
3. The filter may be suited for placement at the output of down-conversion mixers in integrated wireless receivers.
4. The filter topology does not contribute any DC-offsets to the signal path.
5. In applications requiring matching (I/Q paths of a wireless receiver) the filter components have negligible effect on matching.
6. Low noise and high linearity that results in a wide dynamic range. The circuitry provided by the embodiments herein has a negligible effect on degrading noise and linearity.

The embodiments herein provide a filter technique that makes use of passive resistors and capacitors as well as GICs. A GIC 5 generally comprise two operational amplifiers (opamps) 10, 11 and five passive components $Y_1$-$Y_5$ arranged in the configuration shown in FIG. 1. This configuration is typically called Antoniou's GIC. By careful selection of the type of passive components, different functions may be realized. For example, if an active inductor is to be emulated, a GIC can be used with admittances of $Y_2=sC$ and $Y_1=Y_3=Y_4=Y_5=1/R$, where R is a resistor, C is a capacitor, and $s=j*2*pi*f$ where f is the frequency and j indicates it is a complex number. Hence, s describes the frequency behavior of a capacitor (its admittance provides a 90 degrees phase shift and increases linearly with frequency). This results in a total input impedance of $sCR^2$, where $CR^2$ is the effective inductance value. Other choices of $Y_1$-$Y_5$ give different transfer functions.

Figure 2:
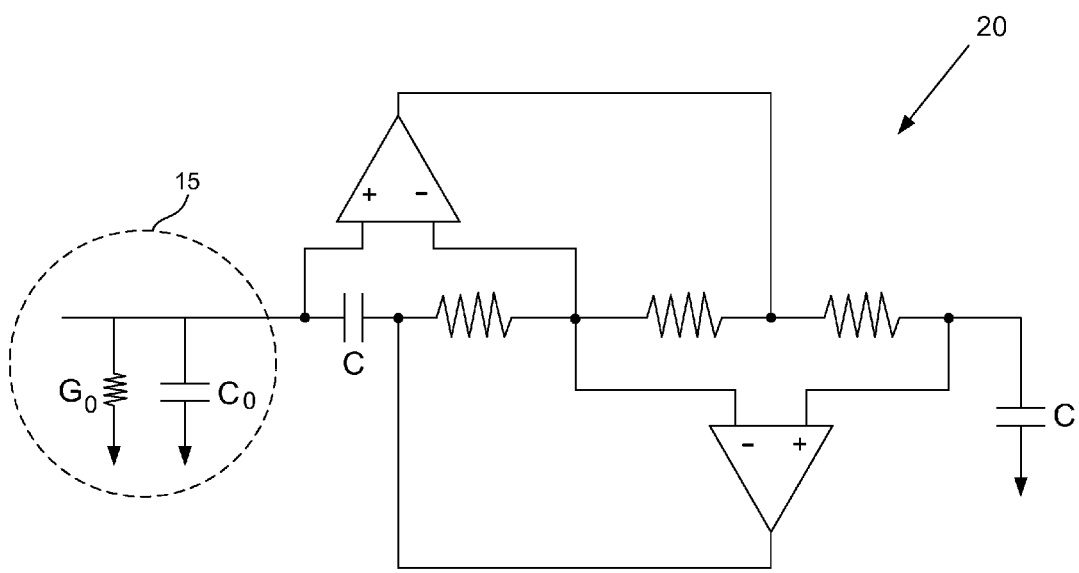
FIG. 2 illustrates a schematic diagram of a third order filter with noise shaping based on a GIC used in accordance with an embodiment herein.
Figure 3:
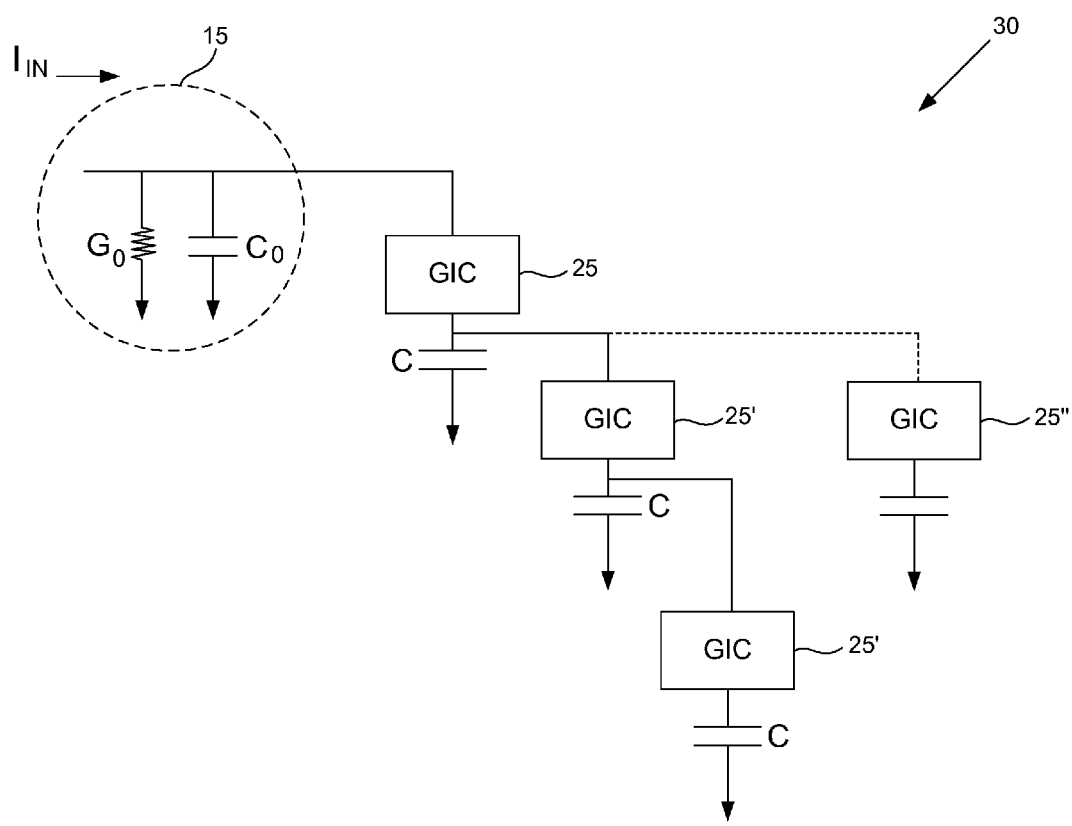
FIG. 3 illustrates a schematic diagram of an nth order GIC-based filter according to an embodiment herein.

If $Y_1=Y_5=sC$ and $Y_2=Y_3=Y_4=1/R$, then this gives a different input admittance of $Y_{in}=s^2RC^2$, which gives a second order roll-off. More interestingly, since $Y_1$ is a capacitor, it effectively acts as a high-pass filter to noise generated by opamps 10, 11. This helps shape the active noise of the opamps 10, 11 to higher frequencies away from the receiver's passband. Combined with a passive RC pole 15, as shown in FIG. 2, a third order filter 20 with low-noise can be realized. This idea can be extended to an nth order filter 30 by nesting the GIC stages 25 (nested GIC stages 25') and adding a passive pole 15 formed by $G_0$ and $C_0$, as shown in FIG. 3. In doing so, the transfer function of the input admittance becomes:

$$Y_{in}(s)=G_0+sC_0+s\alpha_1[sC_1+s\alpha_2(sC_2+s\alpha_3(sC_3+\ldots))] \quad (1)$$

Expanding Equation (1) gives:

$$Y_{in}(s)=G_0+sC_0+s^2\alpha_1 C_1+s^3\alpha_1\alpha_2 C_2+s^4\alpha_1\alpha_2\alpha_3 C_3+\ldots \\ +s^n\alpha_1\alpha_2\ldots\alpha_n \quad (2)$$

Equation (2) gives an nth order all pole system.

Figure 4:
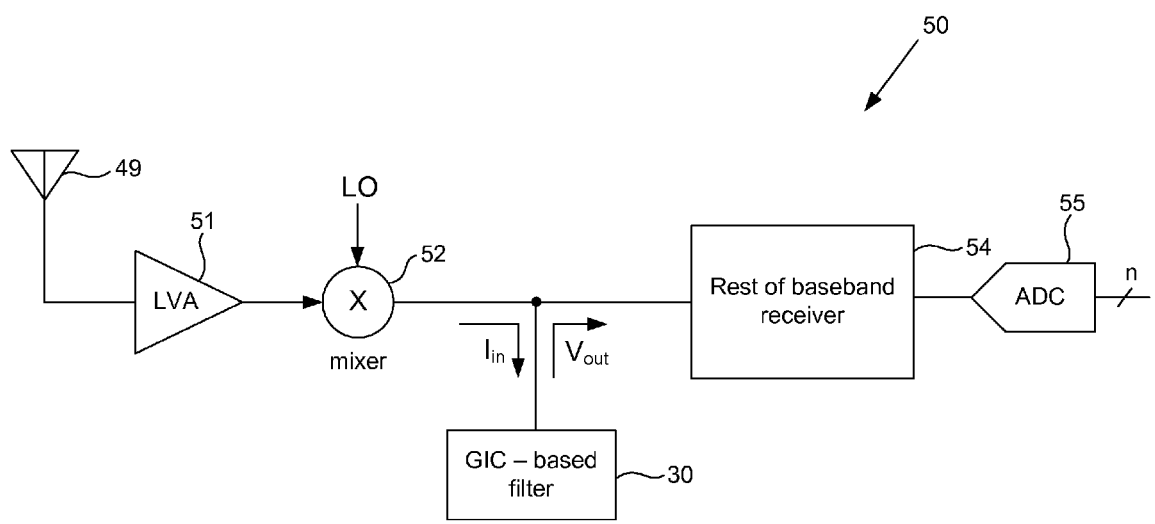
FIG. 4 illustrates a schematic diagram of an nth order filter used in a receiver system according to an embodiment herein.

Since Equation (2) is the input admittance of the filter 30 provided by the embodiments herein, the filter 30 can be used as a post-mixer filter in a front-end communication system 50 that receives a wireless signal through antenna 49, amplifies the signal in the low noise amplifier (LNA) 51, translates the output current of the mixer 52 to a voltage to be processed further in the receiver chain 54, and then converts the analog signal into a digital signal in the analog-to-digital converter (ADC) 55, as shown in FIG. 4.

Figure 5A:
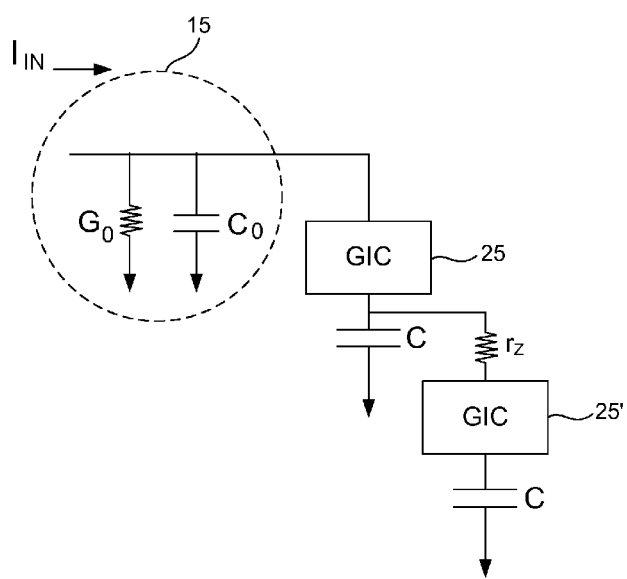
FIG. 5(A) illustrates a schematic diagram of a nested GIC-based filter with a notch according to an embodiment herein.
Figure 5B:
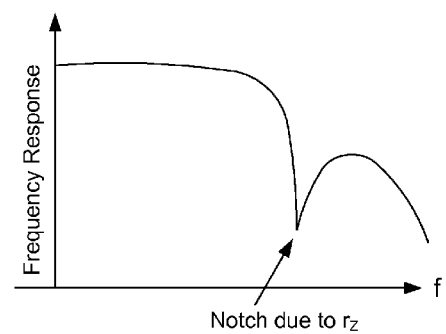
FIG. 5(B) is a graphical illustration representing a frequency response of the filter of FIG. 5(A) according to an embodiment herein.

Moreover, pairs of zeros can be added to the system 50 to realize notches in the transfer function of the filter 30. This is realized by adding a resistor $r_z$ as shown in FIG. 5(A). The corresponding frequency response of the filter 30 (of FIGS. 3 and 4) is shown in FIG. 5(B). The resistor $r_z$ can be added on top of any GIC stage 25, but it is preferred to add it to the nested GIC. This configuration results in reduced noise contribution due to $r_z$ because the noise of the nested GIC stage 25' is attenuated by the previous GIC stage 25. The input admittance in this case is provided in Equation (3):

$$Y_{in}(s) = G_0 + sC_0 + s\alpha_1\left[sC_1 + \cfrac{1}{r_z + \cfrac{1}{s^2\alpha_2 C_2}}\right] \quad (3)$$

which simplifies to Equation (4):

$$Z_{in} = 1/Y_{in}(s) \\ = \frac{1+s^2 r_z \alpha_2 C_2}{G_0 + sC_0 + s^2(\alpha_1 C_1 + G_0 r_z \alpha_2 C_2) + s^3 r_z \alpha_2 C_0 C_2 + s^4 \alpha_1 \alpha_2 r_z C_1 C_3} \quad (4)$$

This is a fourth order system with a single notch. In general, for any even order system, n, there can be up to n/2 notches in the system.

Additionally, elements $Y_1$-$Y_5$ (of FIG. 1) can take on any passive components or resistors and capacitors. As described above, only a limited number of combinations are described herein. According to the embodiments herein, any GIC may be used. Also, a passive real pole 15 has been shown. This is purely optional and can be removed. Also, a nested form of a GIC 25' has been shown. This can be extended to having several GICs 25' and 25" in parallel only, or cascaded and parallel. Also, as described above and provided in the accompanying figures, all GICs 25, 25', 25" are shown as being Antoniou's GIC. In accordance with the embodiments herein, any GIC topology may be used.

FIG. 6 illustrates a flow diagram of a method of filtering noise from an electrical signal according to an embodiment herein, wherein the method comprises arranging (101) a plurality of GICs 25, 25', 25" in successive GIC stages; operatively connecting (103) a capacitor C to each GIC 25, 25', 25", wherein a successive GIC stage begins at a node located in between a preceding GIC stage and a corresponding operatively connected capacitor; introducing (105) a signal through the GICs 25, 25', 25" and corresponding capacitors C; and filtering (107) noise from the signal in each GIC stage. The method may further comprise operatively connecting a resistor $r_z$ to at least one successive GIC stage, wherein the resistor $r_z$ may be located in between the node and a successive GIC stage. The method may further comprise connecting the plurality of GICs 25, 25', 25" in parallel only. Also, the method may further comprise cascading successive GIC stages in parallel. Preferably, successive GIC stages are adapted to attenuate out-of-band signals in a current domain thereby allowing a gain of a preceding GIC stage to be increased.

Generally, the embodiments herein provide a new technique to realize nth order active filters with noise shaping. The noise of the active and passive elements employed in the filter topology is shaped and moved out of the passband of the filter. Using this technique, higher order filters with high selectivity can be designed with low input referred noise, low-power consumption and with a high dynamic range. Noise shaping can also allow the resistor values to be increased. This, in turn, reduces the value of the capacitors employed resulting in a significant chip area savings.

The embodiments herein can be used in the design/implementation of any receiver/transmitter (wireless, TV tuner, cell phones, and satellite tuners). It can also be used in disk-drives, hearing aids, modems, wire line applications or any application that requires the use of a low noise filter.

The techniques provided by the embodiments herein may be implemented on an integrated circuit (IC) chip or using printable electronic technologies (not shown). The chip or printable electronic circuit design is created in a graphical computer programming language, and stored in a computer storage medium (such as a disk, tape, physical hard drive, or virtual hard drive such as in a storage access network). If the designer does not fabricate chips or printable electronic circuits or the photolithographic masks used to fabricate chips or printable electronic circuits, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII or CIF) for the fabrication of photolithographic masks, which typically include multiple copies of the chip design in question that are to be formed on a wafer or printed on a suitable substrate. The photolithographic masks are utilized to define areas of the wafer or printable electronic circuits (and/or the layers thereon) to be etched or otherwise processed or printed.

The resulting integrated circuit chips or printable electronic circuits can be distributed by the fabricator in raw wafer form (that is, as a single wafer that has multiple unpackaged chips), as a bare die, or in a packaged form or as individual printed circuits or in a sheet or roll of printed circuits. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip might then be integrated with other chips, discrete circuit elements, and/or other signal processing devices as part of either (a) an intermediate product, such as a mother or daughter-board, or (b) an end product. The end product can be any product that includes integrated circuit chip or chips and/or printed circuits, ranging from toys and other low-end applications to advanced computer products having a display, a keyboard or other input device, and a central processor.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A low noise nth order filter comprising:
   a plurality of nested general immittance converters (GICs) directly connected to one another in successive GIC stages, wherein a transfer function of said successive GIC stages comprise at least one notch;
   a passive pole directly connected to an input of only a first one of said plurality of GICs: and
   a capacitor directly connected to each of the GICs,
   wherein a first successive GIC stage begins at a first node located in between a previous GIC stage and a corresponding capacitor directly connected to said previous GIC stage.

2. The low noise nth order filter of claim 1, wherein a second successive GIC stage begins at a second node located in between said first node and said first successive GIC stage.

3. The low noise nth order filter of claim 1, further comprising a resistor directly connected to at least one successive GIC stage.

4. The low noise nth order filter of claim 3, wherein said resistor is located in between said first node and said first successive GIC stage.

5. The low noise nth order filter of claim 4, wherein said resistor is directly connected to an input of said at least one successive GIC stage.

6. The low noise nth order filter of claim 5, wherein said resistor is directly connected to each of an output of said previous GIC stage and said capacitor.

7. The low noise nth order filter of claim 1, wherein successive GIC stages attenuate out-of-band signals in a current domain thereby allowing a gain of a preceding GIC stage to be increased.

8. A method of filtering noise from an electrical signal, said method comprising:
   arranging a plurality of general immittance converters (GICs) in successive GIC stages, wherein a transfer function of said successive GIC stages comprise at least one notch;

directly connecting a passive pole to an input of only a first one of said plurality of GICs; and directly connecting a capacitor to each GIC, wherein a successive GIC stage begins at a node located in between a preceding GIC stage and a corresponding operatively connected capacitor;

introducing a signal through said GICs and corresponding capacitors; and filtering noise from said signal in each GIC stage.

9. The method of claim 8, further comprising directly connecting a resistor to at least one successive GIC stage.

10. The method of claim 9, wherein said resistor is located in between said node and a successive GIC stage.

11. The method of claim 10, further comprising directly connecting said resistor to an input of said at least one successive GIC stage.

12. The method of claim 11, further comprising directly connecting said resistor to each of an output of said previous GIC stage and said capacitor.

13. The method of claim 8, wherein successive GIC stages attenuate out-of-band signals in a current domain thereby allowing a gain of a preceding GIC stage to be increased.

14. A system for filtering noise from an electrical signal, said system comprising:

an antenna that receives a wireless electrical signal;

a low noise amplifier (LNA) directly connected to said antenna and amplifies said wireless electrical signal;

a mixer directly connected to said LNA combines the amplified wireless electrical signal with a local oscillator (LO) signal; and a low noise filter directly connected to said mixer, wherein said low noise filter comprises:

a plurality of general immittance converters (GICs) arranged in successive GIC stages, wherein a transfer function of said successive GIC stages comprise at least one notch;

a passive pole directly connected to an input of only a first one of said plurality of GICs;

a capacitor directly connected to each GIC, wherein a successive GIC stage beings at a node located in between a preceding GIC stage and a corresponding capacitor directly connected to said preceding GIC stage;

a baseband component directly connected to said low noise filter; and an analog-to-digital converter that converts the filtered wireless electrical signal to a digital signal.

15. The system of claim 14, wherein a second successive GIC stage begins at a second node located in between said first node and said first successive GIC stage.

16. The system of claim 14, further comprising a resistor directly connected to at least one successive GIC stage.

17. The system of claim 14, wherein said resistor is located in between said first node and said first successive GIC stage.

18. The system of claim 17, wherein said resistor is directly connected to an input of said at least one successive GIC stage.

19. The system of claim 18, wherein said resistor is directly connected to each of an output of said previous GIC stage and said capacitor.

20. The system of claim 14, wherein successive GIC stages attenuate out-of-band signals in a current domain thereby allowing a gain of said preceding GIC stage to be increased.

* * * * *